United States Patent [19]

Anderson

[11] Patent Number: 5,748,050
[45] Date of Patent: May 5, 1998

[54] LINEARIZATION METHOD AND APPARATUS FOR VOLTAGE CONTROLLED OSCILLATOR

[75] Inventor: Michael B. Anderson, Colorado Springs, Colo.

[73] Assignee: Symbios Logic Inc., Fort Collins, Colo.

[21] Appl. No.: 625,452

[22] Filed: Mar. 29, 1996

[51] Int. Cl.$^6$ ............................................. H03B 5/00
[52] U.S. Cl. .................................... 331/57; 331/177 R
[58] Field of Search ............................ 331/57, 176, 177 R, 331/177 V

[56] References Cited

U.S. PATENT DOCUMENTS

| | | | |
|---|---|---|---|
| 3,397,367 | 8/1968 | Steel et al. | 331/176 |
| 3,531,739 | 9/1970 | Groves | 331/176 |
| 3,546,617 | 12/1970 | Westwood | 331/2 |
| 3,886,485 | 5/1975 | Takahashi | 331/111 |
| 3,904,988 | 9/1975 | Hsiao | 331/111 |
| 4,047,126 | 9/1977 | Anderson | 331/177 V |
| 4,230,953 | 10/1980 | Wilcox | 331/116 R |
| 4,254,382 | 3/1981 | Keller et al. | 331/116 R |
| 4,370,629 | 1/1983 | Martin | 331/179 |
| 4,388,596 | 6/1983 | Yamashita | 331/1 A |
| 4,442,412 | 4/1984 | Smith et al. | 331/1 A |
| 4,492,934 | 1/1985 | Sugimoto | 331/117 R |
| 4,568,888 | 2/1986 | Kimura et al. | 331/10 |
| 4,700,285 | 10/1987 | Szepesi | 363/97 |
| 4,853,654 | 8/1989 | Sakurai | 331/57 |
| 4,879,530 | 11/1989 | Wilhelm et al. | 331/45 |
| 4,890,072 | 12/1989 | Espe et al. | 331/11 |
| 4,918,404 | 4/1990 | Vitiello et al. | 331/11 |
| 4,935,706 | 6/1990 | Schenberg | 331/11 |
| 4,975,662 | 12/1990 | Takeuchi | 331/111 |
| 4,988,955 | 1/1991 | Horie | 331/11 |
| 5,028,888 | 7/1991 | Ray | 331/57 |
| 5,041,799 | 8/1991 | Pirez | 331/176 |
| 5,070,311 | 12/1991 | Nicolai | 331/111 |
| 5,081,429 | 1/1992 | Atriss et al. | 331/57 |
| 5,105,169 | 4/1992 | Yamazaki et al. | 331/34 |
| 5,121,086 | 6/1992 | Srivastava | 331/11 |
| 5,136,260 | 8/1992 | Yousefi-Elezei | 331/17 |
| 5,142,249 | 8/1992 | Hirotomi | 331/57 |
| 5,198,784 | 3/1993 | Fenk | 331/117 R |
| 5,208,557 | 5/1993 | Kersh, III | 331/57 |
| 5,212,459 | 5/1993 | Ueda et al. | 331/111 |
| 5,250,913 | 10/1993 | Gleichert et al. | 331/25 |
| 5,272,453 | 12/1993 | Traynor et al. | 331/57 |
| 5,278,522 | 1/1994 | Atriss et al. | 331/57 |
| 5,285,114 | 2/1994 | Atriss et al. | 307/264 |
| 5,285,173 | 2/1994 | Reynolds | 331/57 |
| 5,300,898 | 4/1994 | Chen et al. | 331/57 |
| 5,302,920 | 4/1994 | Bitting | 331/45 |
| 5,331,295 | 7/1994 | Jelinek et al. | 331/57 |
| 5,379,001 | 1/1995 | Hedtke | 331/4 |
| 5,477,198 | 12/1995 | Anderson et al. | 331/177 R |
| 5,483,195 | 1/1996 | Brown | 330/254 |

OTHER PUBLICATIONS

Kurt M. Ware et al.; A 200–Mhz CMOS Phase–Locked Loop with Dual Phase Detectors; Dec., 1989; pp. 1560–1568 IEEE Journal of Solid State Circuits, vol. 24, No. 6.

Deog–Kyoon Jeong et al.; Design of PLL–Based Clock Generation; Apr., 1987; pp. 255–261, IEEE Journal of Solid–State Circuits, vol. SC–22, No. 2.

A Low Jitter 5 Mhz to 180 Mhz Clock Synthesizer for Video Graphics; reza Shariatdoust et al.; IEEE 1992 Custom Integrated Circuits Conference; Mar. 5, 1992; pp. 24.2.1–24.2.5.

*Primary Examiner*—Siegfried H. Grimm
*Attorney, Agent, or Firm*—Wayne P. Bailey

[57] ABSTRACT

A voltage controlled oscillator (VCO) having a generally linear transfer characteristic across a wide frequency range of operation. The VCO is comprised of a voltage-to-current converter (V-I) and a current-controlled oscillator (ICO). A linearization of the output response of the VCO is accomplished by proper selection of the output responses of the V-I and ICO circuits, where the V-I portion is designed to have an inverse nonlinearity response as compared to the nonlinearity response of the ICO portion of the VCO. The combined effect is a linear response for the VCO. A nonlinear V-I characteristic can be achieved by adding several piecewise linear responses together to produce a combined nonlinear response.

2 Claims, 12 Drawing Sheets

5,748,050

LINEARIZATION METHOD AND APPARATUS FOR VOLTAGE CONTROLLED OSCILLATOR

TECHNICAL FIELD

The present invention relates to an electrical circuit, and more particularly it relates to a technique for linearizing the output response of a voltage controlled oscillator.

BACKGROUND OF THE INVENTION

Voltage controlled oscillators (VCOs) are used within phase-locked loops (PLL) for clock synthesis, bit synchronization, etc. (refer to "Phase-Locked Loops", by R. Best, for background descriptions of operation and applications of PLLs). Voltage controlled ring oscillators tend to have a nonlinear transfer characteristic. This is due to the inherently nonlinear response of the current controlled oscillator which is a subcircuit of the VCO. Most designs assume linearity, which can be a reasonable approximation for small increments. However, prior techniques for implementing PLLs generally do not exhibit such linearity across a wide frequency range of operation.

A typical phase-locked loop is shown at 50 in FIG. 10. The input reference phase 52 is compared at 58 to the output 54 of the VCO 62. The charge pump 59 regulates the amount of charge on the loop filter 60. The output 61 of the loop filter 60 is a voltage that controls the frequency of the oscillator 62. A VCO 62 typically consists of two stages: a voltage-to-current (V-I) converter, and a current controlled oscillator (ICO). The VCO output frequency varies proportionally to the input voltage of the V-I converter.

For the design of PLLs, it is desirable to have a linear response across the entire frequency range of operation. This helps maintain stability and tracking in the PLL. U.S. Pat. No. 5,477,198, entitled "Extendible-Range Voltage Controlled Oscillator", and which is hereby incorporated herein by reference, teaches a technique for extending and linearizing the transfer characteristic of a voltage controlled oscillator. While feasible, this technique requires a booster inverter biasing scheme.

SUMMARY OF THE INVENTION

The present invention is directed to a voltage controlled oscillator (VCO) having a generally linear transfer characteristic across a wide frequency range of operation. The VCO includes of a voltage-to-current converter (V-I) and a current-controlled oscillator (ICO). A linearization of the output response of the VCO is accomplished by proper selection of the output responses of the V-I and ICO circuits, where the V-I portion is designed to have an inverse non-linearity response as compared to the nonlinear response of the ICO portion of the VCO. The combined effect is a linear response for the VCO. A nonlinear V-I characteristic can be achieved by combining several individual piecewise linear responses together to produce a combined piecewise linear signal having a nonlinear response. Thus, the technique compensates for the inherently nonlinear response of an ICO by implementing a nonlinear V-I which controls the ICO.

It is an object of the present invention to provide an improved phase-locked loop circuit.

It is another object of the present invention to provide an improved voltage controlled oscillator circuit.

It is yet another object of the present invention to provide a voltage controlled oscillator having linear characteristics.

It is still another object of the present invention to provide a voltage controlled oscillator having linear characteristics over a wide frequency range.

It is yet another object of the present invention to provide a signal having non-linear characteristics that are inversely proportional to another non-linear signal.

It is another object of the present invention to approximate a non-linear transfer characteristic with a piecewise linear signal.

Additional benefits and advantages of the present invention will become apparent to those skilled in the art to which this invention relates from the subsequent description of the preferred embodiments and the appended claims, taken in conjunction with the accompanying drawings.

DETAILED DESCRIPTION OF THE PREFERRED EMBODIMENT

Figure 1:
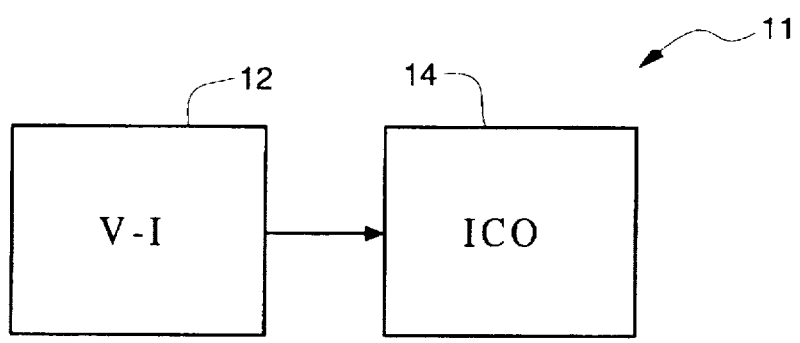
FIG. 1 depicts a voltage-to-current converter coupled to a current-controlled oscillator.
Figure 2:
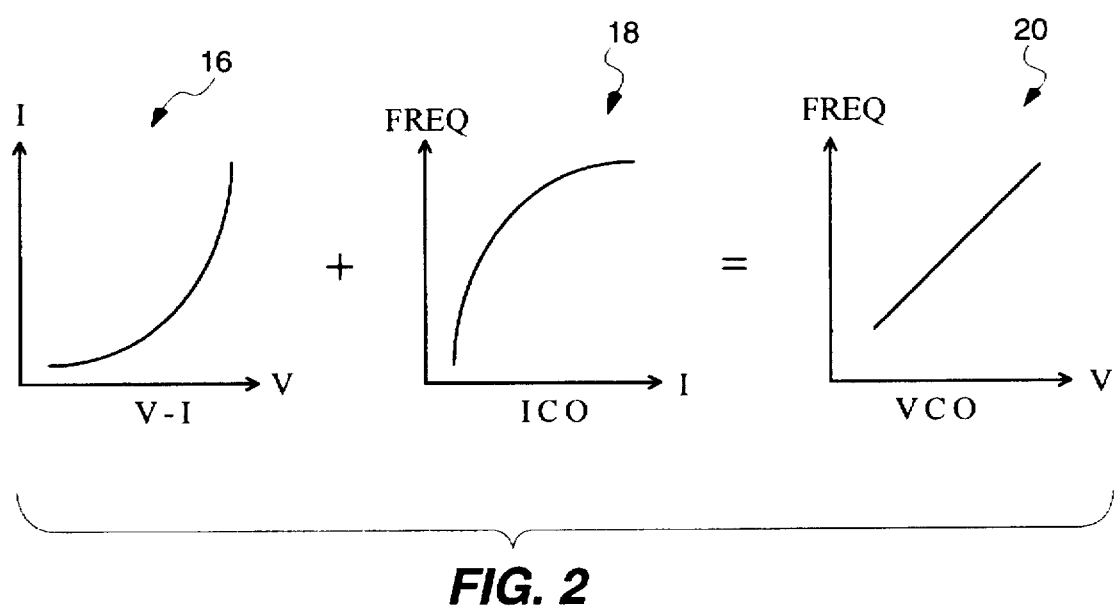
FIG. 2 graphically depicts response characteristics of the voltage-to-current controller and the current-controlled oscillator.
Figure 3A:
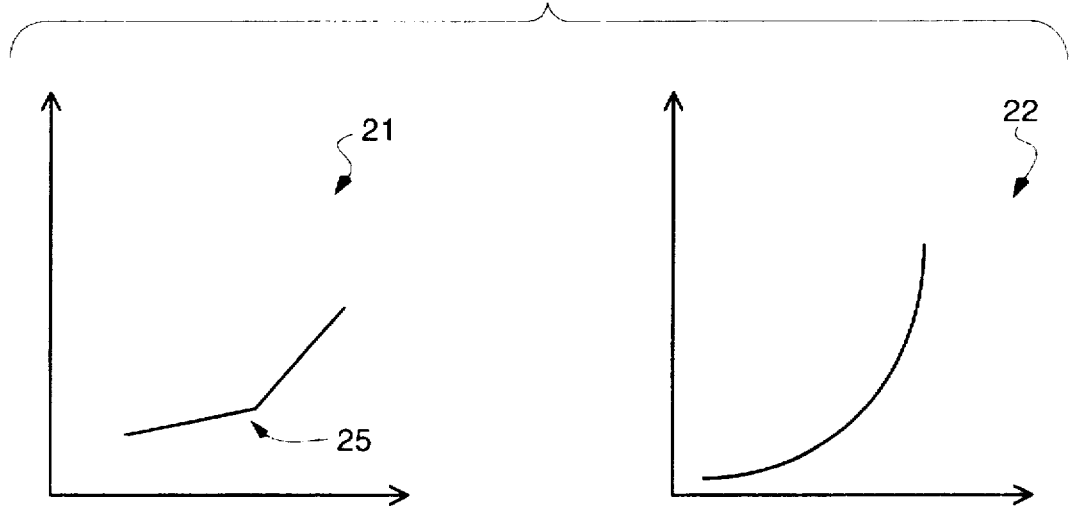
FIGS. 3A and 3B graphically depict approximating a non-linear response by combining piecewise linear portions.
Figure 3B:
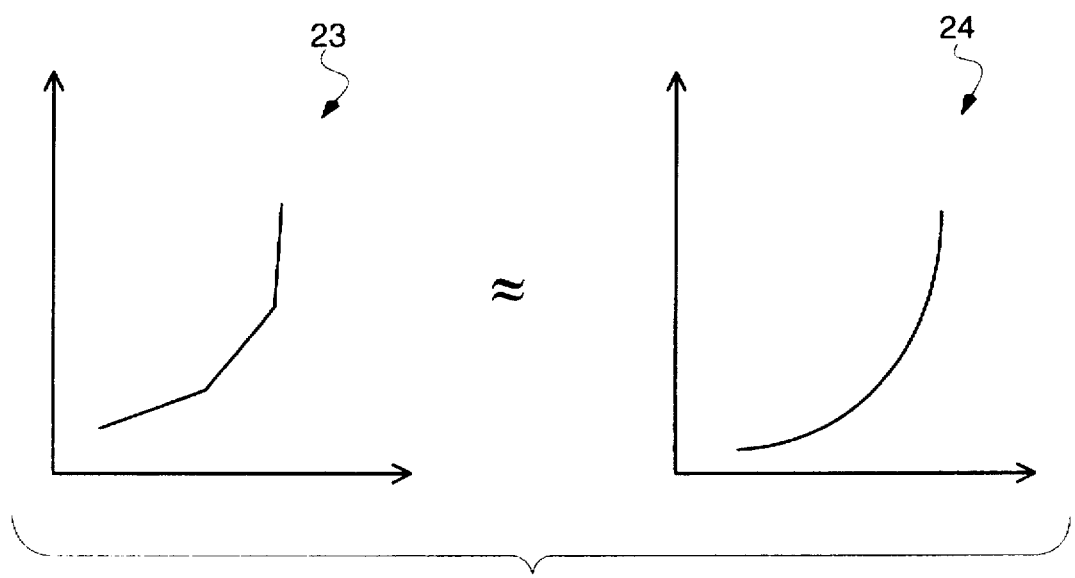

As shown in FIG. 1, the voltage controlled oscillator (VCO) 11 is comprised of a voltage-to-current converter (V-I) 12, and a current-controlled oscillator (ICO) 14. The linearization technique is illustrated in FIG. 2, where the V-I portion is designed to have an inverse nonlinearity (as shown at 16) compared to the ICO portion (as shown at 18) of the VCO. The combined effect is a linear response for the VCO, as shown at 20. A nonlinear V-I characteristic can be achieved by adding several piecewise linear responses together to produce a combined nonlinear response. This is illustrated in FIGS. 3A and 3B. In FIG. 3A, two linear responses are pieced together (as shown at 21) to approximate the non-linear response curve shown at 22. In FIG. 3B, three linear responses are pieced together (as shown at 23) to approximate the non-linear response curve shown at 24. The number of linear responses required is decided by the designer.

Figure 4:
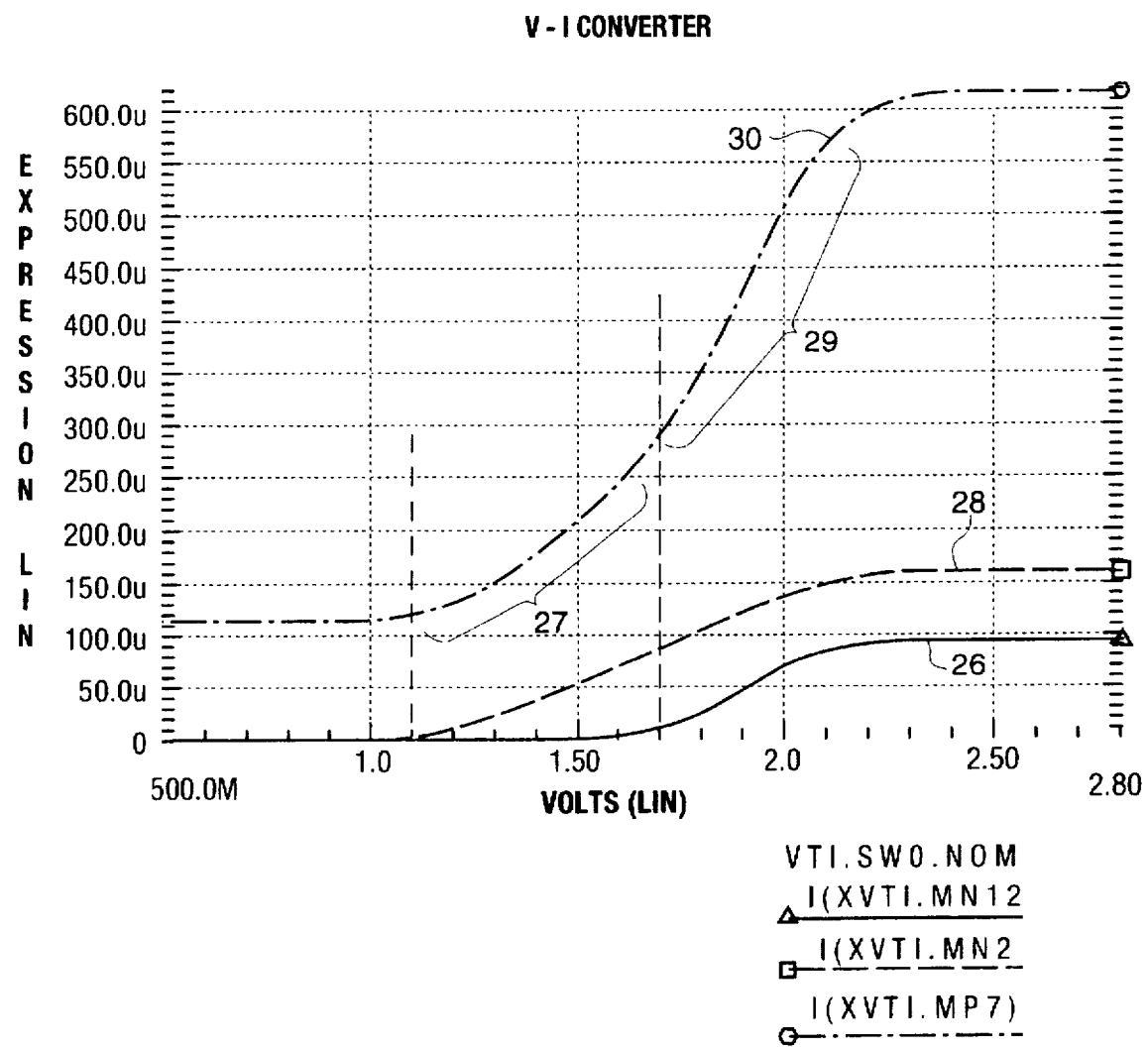
FIG. 4 is a plot of the transfer characteristic for the voltage-to-current controller.
Figure 5A:
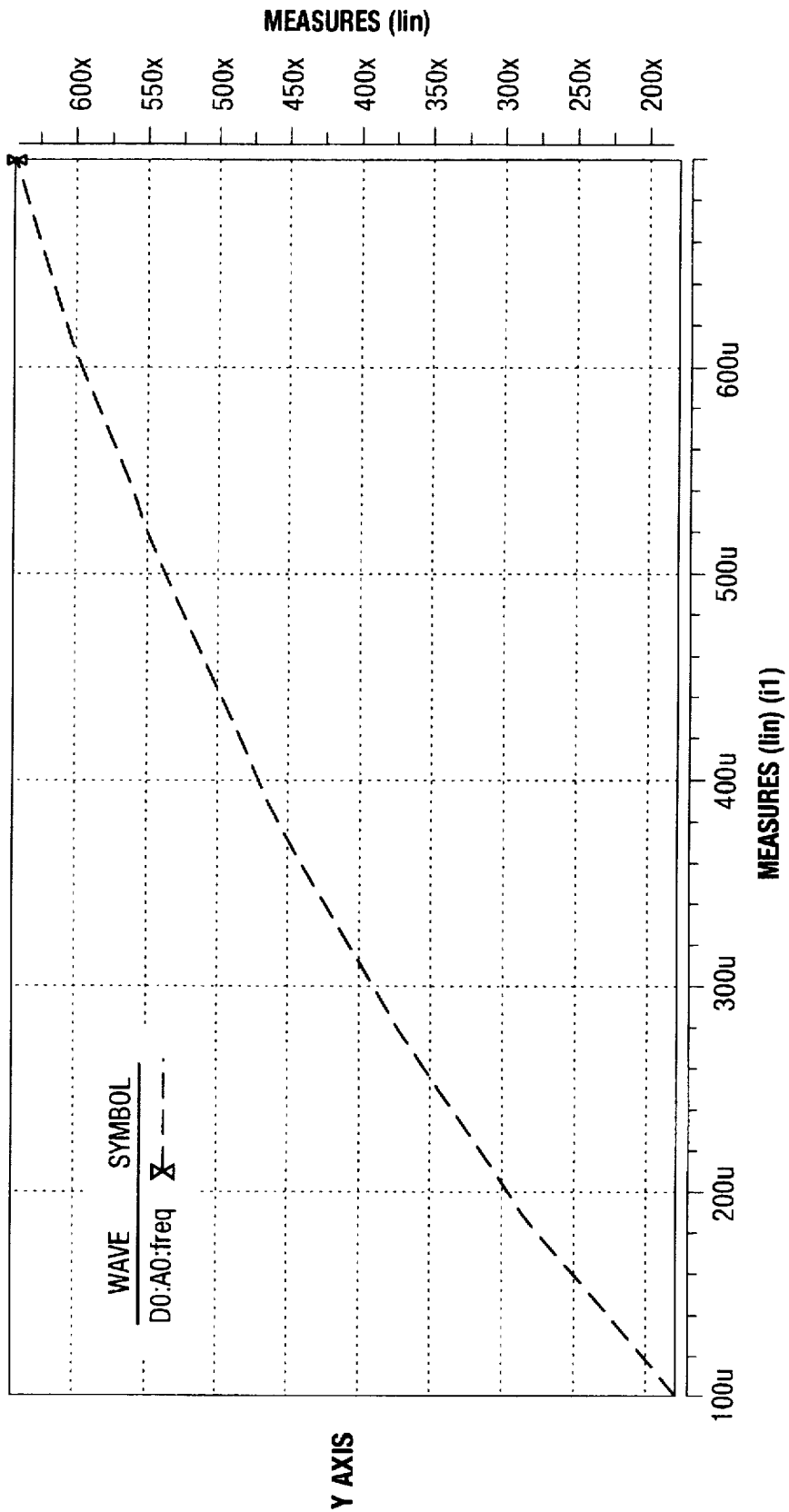
FIG. 5A is a plot of the frequency versus current transfer characteristic for the current-controlled oscillator.
Figure 5B:
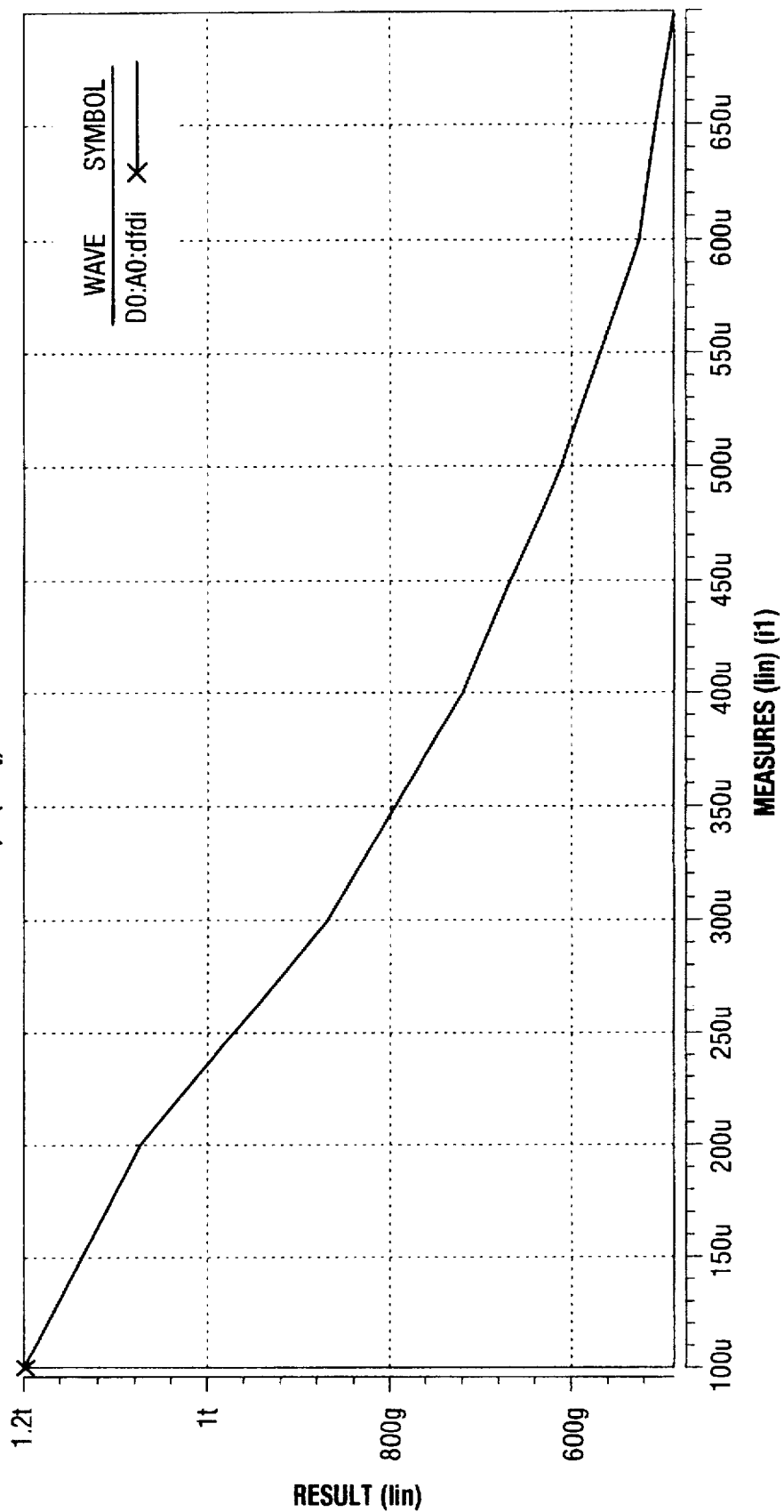
FIG. 5B is a plot of the derivative, with respect to time, of the transfer characteristic shown in FIG. 5A.
Figure 6A:
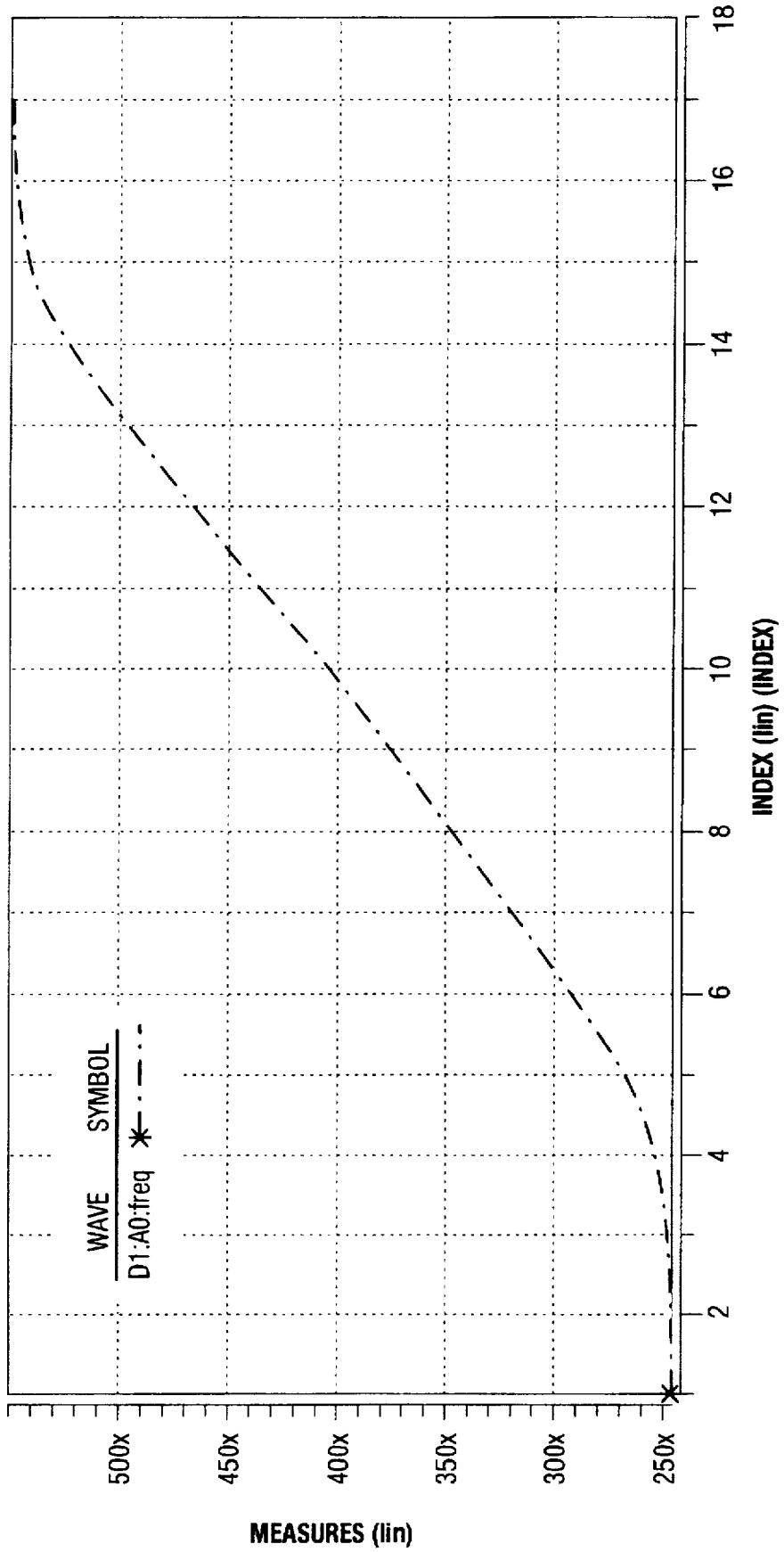
FIG. 6A is a plot of the frequency versus voltage transfer characteristic for the overall voltage-controlled oscillator.
Figure 6B:
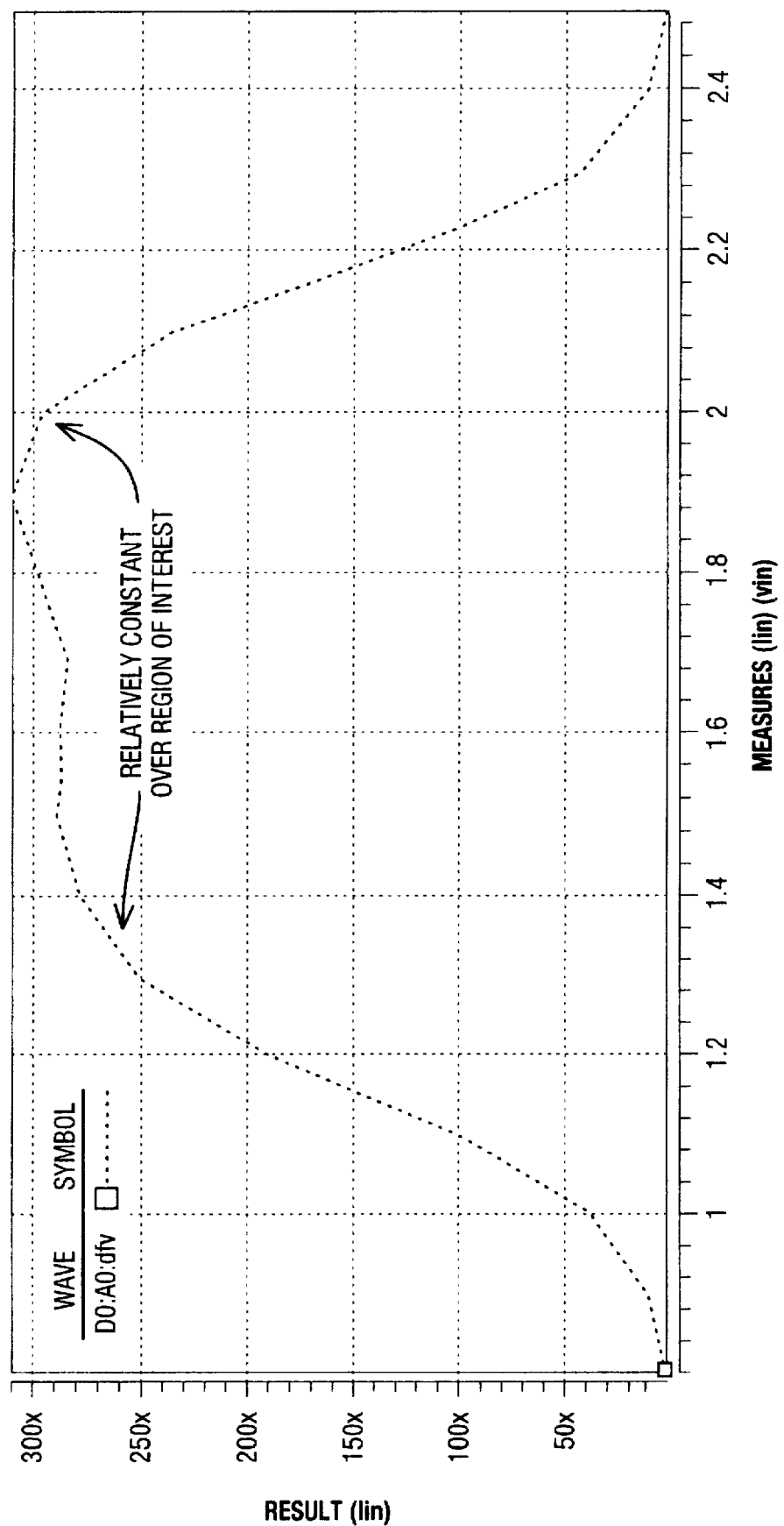
FIG. 6B is a plot of the derivative, with respect to time, of the transfer characteristic shown in FIG. 6A.

In the preferred embodiment, two linear segments (as shown in FIG. 3A) are used to produce a combined piecewise linear signal having a nonlinear response. The V-I circuit sums the currents from the two linear segments together. This is plotted in FIG. 4. Here we see the two smaller currents 26 and 28 that are combined and amplified to produce the larger current 30. This larger composite current now takes on a nonlinear characteristic. This composite current is then combined with the nonlinear response of the ICO, shown in FIG. 5A. The combined V-I and ICO (VCO) response is shown in FIG. 6A. Note the differences between the ICO characteristic shown in FIG. 5A, and the overall VCO characteristic shown in FIG. 6A. The ICO is nonlinear, while the VCO is generally linear across the entire frequency range. This is further shown in FIGS. 5B and 6B, where the derivatives of the respective transfer characteristics are shown. As can be seen in FIG. 5B, the nonlinearity of the frequency with respect to current shown in FIG. 5A is further emphasized, since the derivative is not constant. As can be seen in FIG. 6B, the linearity of the frequency with respect to voltage shown in FIG. 6A is further emphasized, since the derivative is relatively constant in the operating region of interest.

Figure 7:
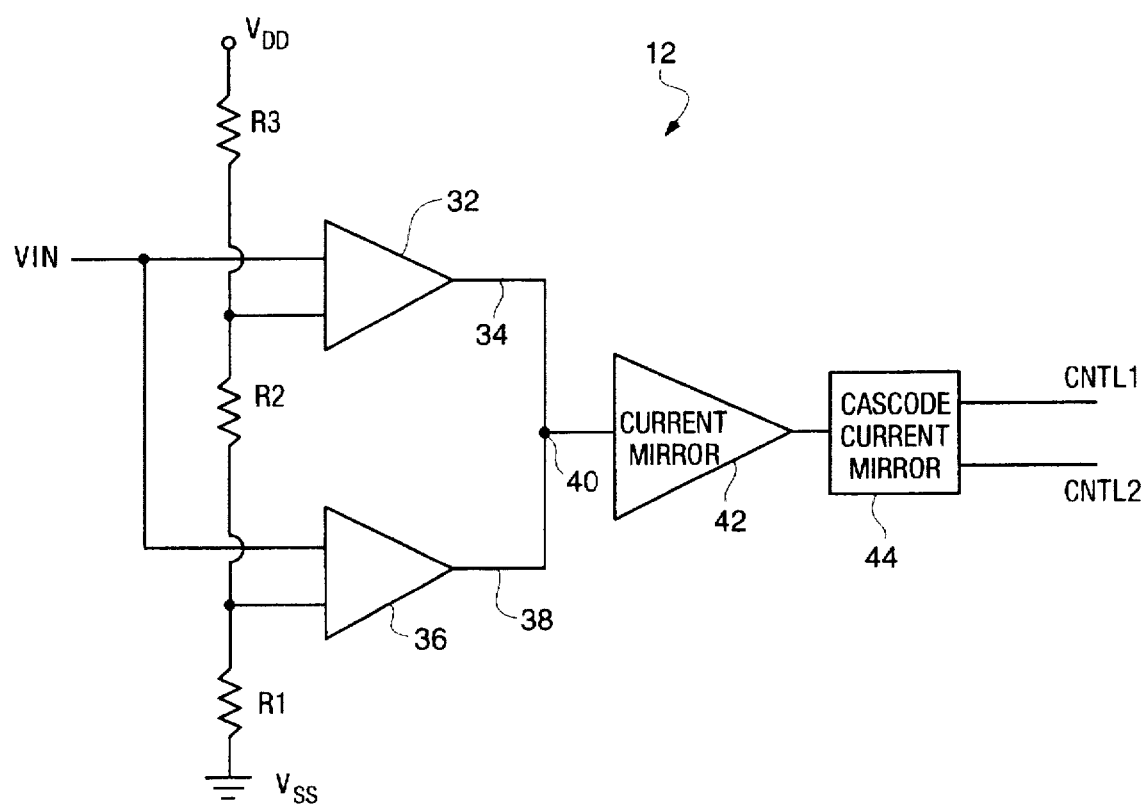
FIG. 7 is a block diagram of the voltage-to-current converter circuit.

A block diagram of the V-I circuit which produces a piecewise linear signal is shown in FIG. 7. Two differential pairs 32 and 36 are provided to supply the two linear segments previously described. The outputs of differential pair 32 and differential pair 36 are summed together at 40, and amplified by current mirror 42. The resultant summed and amplified current is graphically shown at 30 of FIG. 4, and is the amplified sum of currents 34 and 38 (such currents graphically depicted in FIG. 4 at 26 and 28, respectively). Current mirror 42 is coupled to cascode current mirror 44, which outputs control signals CNTL1 and CNTL2 for controlling ICO 14 (as further described below). Resistors R1, R2 and R3 are used to establish reference voltages for the differential pairs 32 and 36, as will be further described below.

Figure 8:
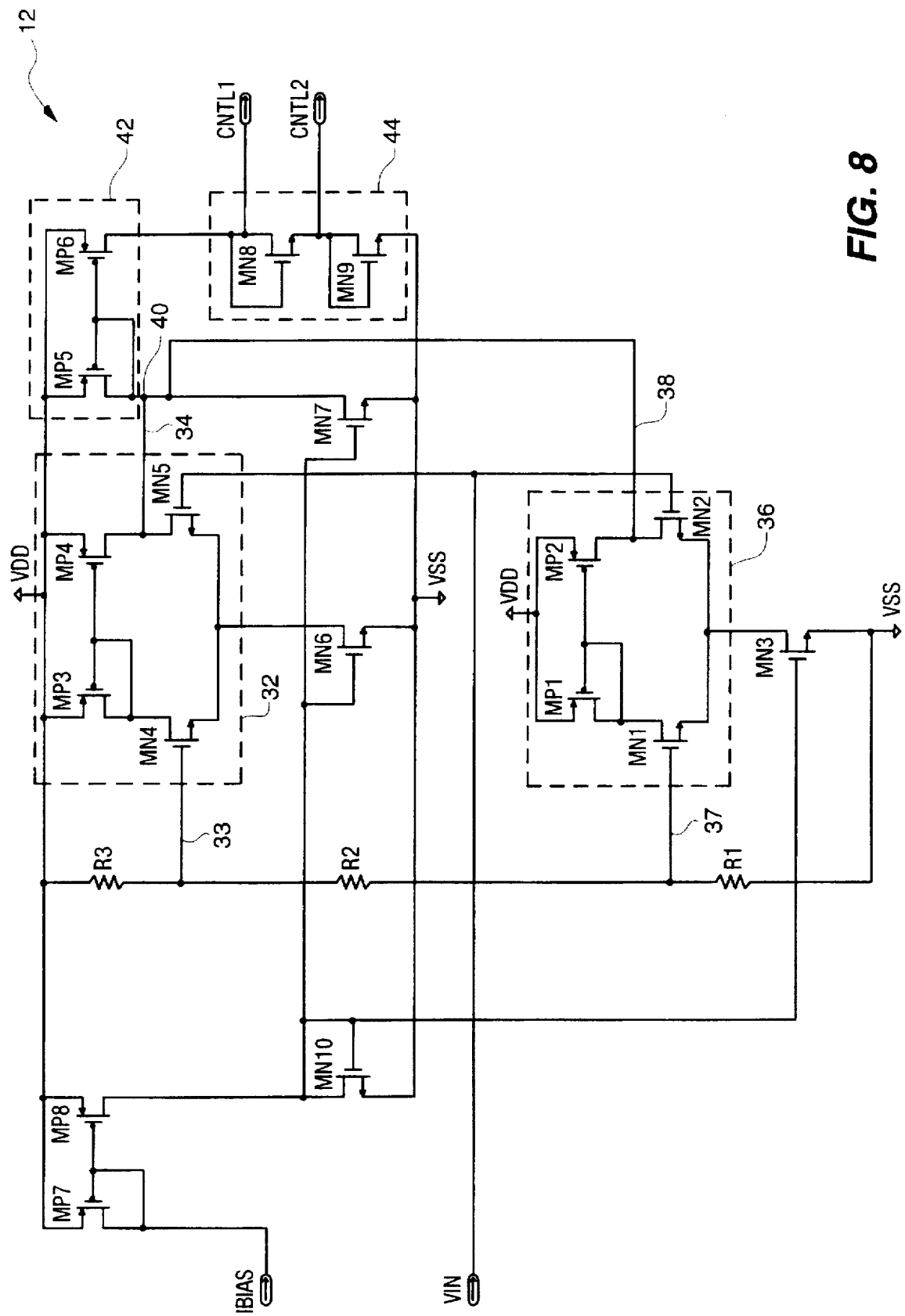
FIG. 8 is a detailed schematic for the voltage-to-current converter circuit.

FIG. 8 shows the preferred embodiment for the detailed circuitry for the piecewise linear voltage-to-current converter 12. Input signal IBIAS is current from a traditional constant current source known in the art. Transistor pair MP7 and MP8 operates as a current mirror, whereby the IBIAS current passing through MP7 is mirrored to MP8, such that the current IBIAS then passes through transistor MN10. MN10 then mirrors current to transistors MN6, MN7 and MN3 which act as constant current sources. Two differential pairs are provided to supply the two linear segments previously described. A first differential pair 32 is constructed from transistors MP3, MP4, MN4 and MN5, and has an output 34. An input voltage VIN is provided to the gate of transistor MN5, which is one of two inputs to the first differential pair 32. The other input to the first differential pair 32 is coupled to the gate of transistor MN4, which is coupled to a reference voltage by way of resistors R1, R2 and R3 coupled between supply voltages VDD and VSS. A second differential pair 36 is constructed from transistors MP1, MP2, MN1 and MN2, and has an output 38. The input voltage VIN is also provided to the gate of transistor MN2, which is one of two inputs to the second differential pair 36. The other input to the second differential pair 36 is coupled to the gate of transistor MN1, which is coupled to a second reference voltage by way of resistors R1, R2 and R3 coupled between supply voltages VDD and VSS.

Figure 10:
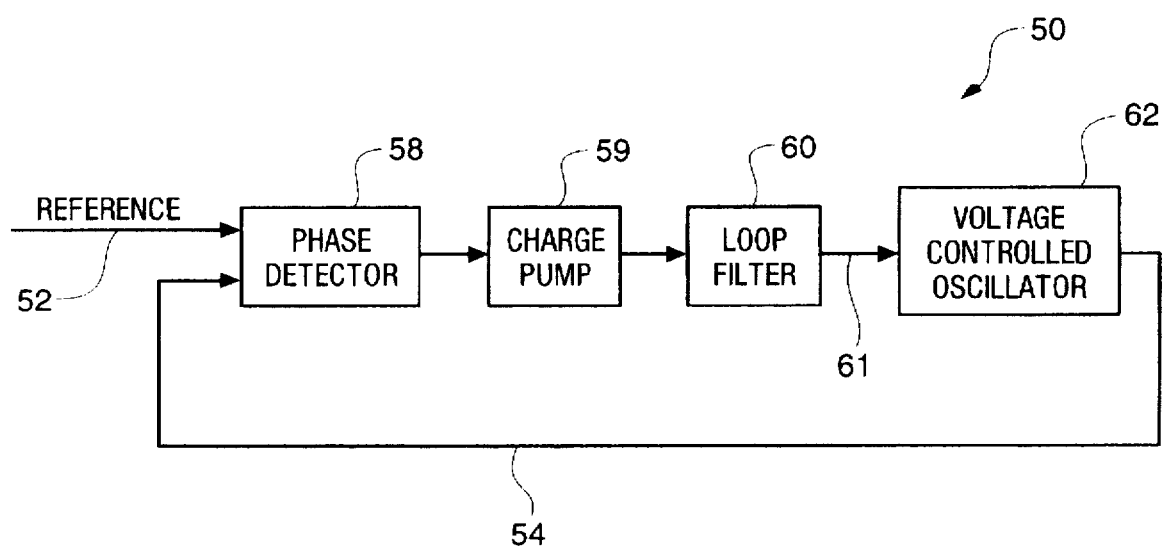
FIG. 10 is a block diagram of a phase-locked loop circuit.

The first differential pair circuit 32 operates as follows. Input voltage VIN comes from a standard PLL loop filter, and represents the PLL error signal (see, for example, FIG. 10). When VIN is at zero volts, transistor MN5 is OFF. As described above, transistor MN6 is a constant current source, and hence the current from MN6 passes through MN4, MP3 and mirrored to MP4. Since MN5 is off, the current through MP4 must go through constant current source MN7. Thus, less current is going through MP5 and being mirrored to MP6. Transistors MN8 and MN9 act as current mirrors to the ICO. Therefore, when there is less current through MP6, MN8 and MN9, a smaller current will be mirrored to the ICO. When VIN has an increasing voltage, transistor MN5 has increasing current and MN4 has decreasing current. The current in current mirror MP5/MP6 increases, causing outputs CNTL1 and CNTL2 to mirror more current to the ICO. The graphical response to the above described circuit operation is shown at 26 in FIG. 4 (where graph 26 represents output current at 34 of FIG. 8).

The second differential pair circuit 36 operates as follows. As can be seen, both the first and second differential pairs have a common input VIN. The reference voltage presented at the second input 37 of the second differential pair is less than the reference voltage presented at the second input 33 of the first differential pair—due to the voltage divider network R1, R2 and R3. Thus, the second differential pair turns on, or is enabled, at a lower input voltage VIN than the first differential pair. Otherwise, the second differential pair operates similar to the first differential pair, but uses transistor MN3 as its constant current source. The graphical response to the above described circuit operation is shown at 28 in FIG. 4 (where graph 28 represents output current at 38 of FIG. 8). The lower turn-on voltage is shown to be approximately 1.1 volts (in contrast to the turn-on voltage for the first differential pair 32, which has a turn on voltage of approximately 1.7 volts).

Returning to FIG. 8, the outputs of the first differential pair 32 and the second differential pair 36 are summed together at 40, and amplified by the MP5/MP6 current mirror 42. Current mirror 42 amplifies by choosing appropriate transistor width/length ratios using standard techniques known in the art. The resultant summed and amplified current is graphically shown at 30 of FIG. 4, and is the amplified sum of currents 34 and 38 (such currents graphically depicted in FIG. 4 at 26 and 28, respectively). Note particularly that the slope of graph 30 increases (shown as region 27) when the second differential pair turns on, when VIN is at approximately 1.1 volts. The slope of graph 30 further increases (shown as region 29) when the first differential pair turns on, when VIN is at approximately 1.7 volts. This change in slope at the turn on of the first differential pair, where both differential pairs are contributing to the overall summed current, is also conceptually shown at 25 of FIG. 3A.

Figure 9:
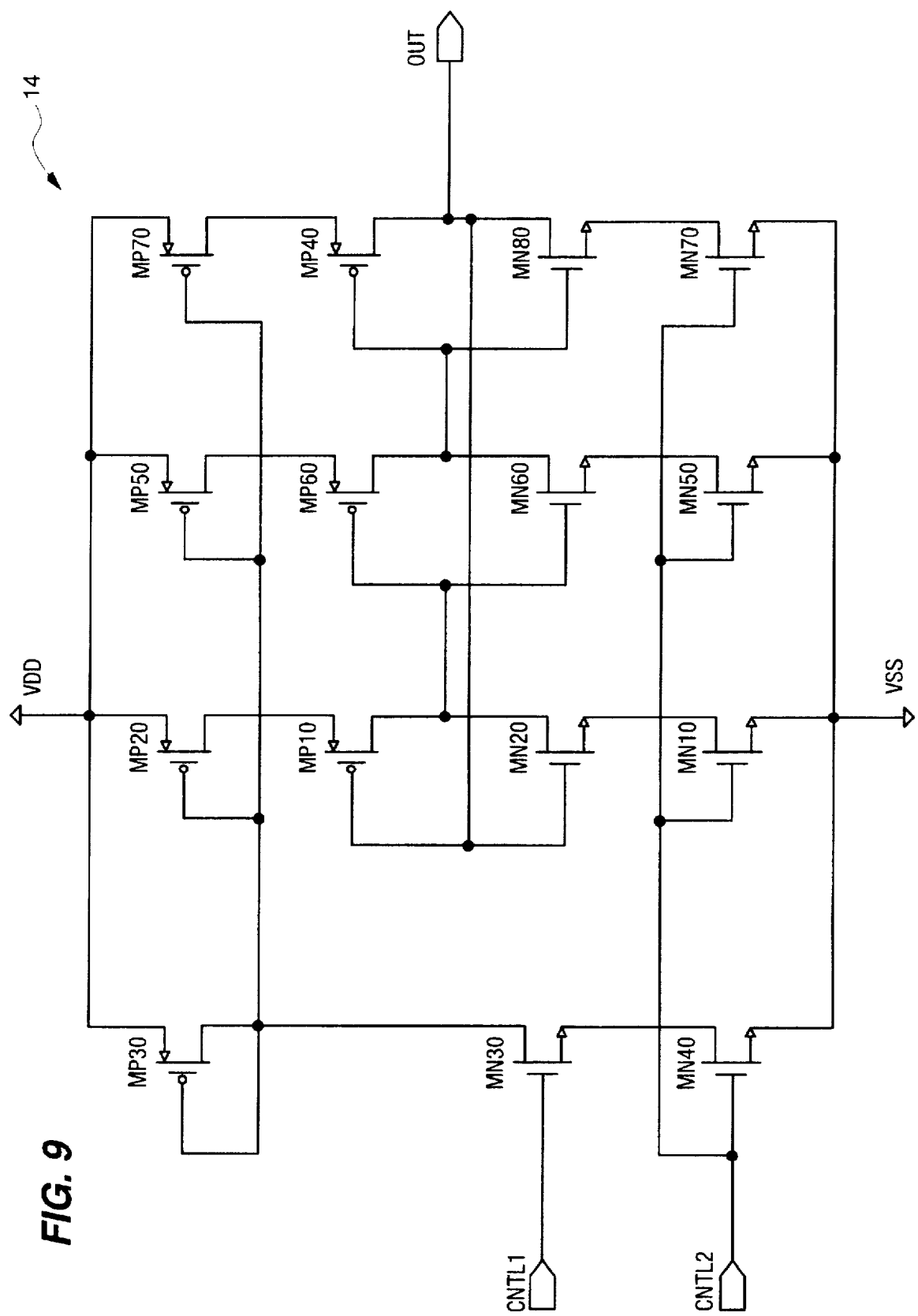
FIG. 9 is a detailed schematic for the current-controlled oscillator circuit.

FIG. 9 shows the preferred embodiment for the detailed circuitry for the current-controlled ring oscillator. This ICO is standard in the arts and need not be described in detail herein. The inputs CNTL1 and CNTL2 are coupled to the CNTL1 and CNTL2 outputs from the V-I converter of FIG. 8 to create the VCO 11 of FIG. 1.

In summary, it has been shown that by combining piecewise linear segments, a nonlinear response can be generated by a voltage-to-current circuit in order to compensate for the nonlinear response of a current-controlled oscillator. Thus, an overall, combined linear response for a voltage controlled oscillator is achieved.

While I have illustrated and described the preferred embodiments of my invention, it is to be understood that I do not limit myself to the precise constructions herein disclosed, and the right is reserved to all changes and modifications coming within the scope of the invention as defined in the appended claims.

I claim:

1. A voltage controlled oscillator circuit, comprising:
   a first differential amplifier having a first and second input, and an output;

a second differential amplifier having a first and second input, and an output;

a voltage signal coupled to the first input of the first differential amplifier and the first input of the second differential amplifier; and a voltage circuit providing a first and second voltage, the second voltage being different than the first voltage, wherein the first voltage is coupled to the second input of the first differential amplifier and the second voltage is coupled to the second input of the second differential amplifier, wherein the output of the first differential amplifier is operatively coupled to the output of the second differential amplifier to form a summed output and wherein the summed output is operatively coupled to an oscillator having a clock output with a frequency that generally increases linearly with respect to an increase in voltage of the voltage signal.

2. A method for operating the circuit of claim 1, comprising the steps of:

increasing the voltage of the voltage signal;

enabling current flow at the output of the first differential amplifier at time T1; and enabling current flow at the output of the second differential amplifier at time T2.

* * * * *